(12) United States Patent
Ishibashi et al.

(10) Patent No.: US 11,600,538 B2
(45) Date of Patent: Mar. 7, 2023

(54) SIC EPITAXIAL WAFER AND METHOD FOR PRODUCING SIC EPITAXIAL WAFER

(71) Applicant: SHOWA DENKO K.K., Tokyo (JP)

(72) Inventors: Naoto Ishibashi, Chichibu (JP); Koichi Murata, Yokosuka (JP); Hidekazu Tsuchida, Yokosuka (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 17/456,506

(22) Filed: Nov. 24, 2021

(65) Prior Publication Data
US 2022/0173001 A1 Jun. 2, 2022

(30) Foreign Application Priority Data
Nov. 30, 2020 (JP) .............................. JP2020-199012

(51) Int. Cl.
*H01L 21/02* (2006.01)
*H01L 21/66* (2006.01)
*C23C 16/32* (2006.01)

(52) U.S. Cl.
CPC ............ *H01L 22/20* (2013.01); *C23C 16/325* (2013.01); *H01L 21/02529* (2013.01); *H01L 21/02634* (2013.01); *H01L 21/02664* (2013.01); *H01L 21/02378* (2013.01)

(58) Field of Classification Search
CPC ......... H01L 21/02378; H01L 21/02447; H01L 21/02529; H01L 21/0445; H01L 29/1608; H01L 29/66053; C23C 16/325; C23C 14/0635
See application file for complete search history.

(56) References Cited

U.S. PATENT DOCUMENTS

| 2015/0214049 A1* | 7/2015 | Kawada ............ H01L 21/02378 117/88 |
| 2017/0317174 A1* | 11/2017 | Hiyoshi .............. H01L 29/1608 |

FOREIGN PATENT DOCUMENTS

| JP | 2006-21954 A | 1/2006 |
| JP | 2014-99483 A | 5/2014 |
| JP | 2016-63190 A | 4/2016 |
| JP | 2016-132604 A | 7/2016 |
| WO | 2016/117209 A1 | 7/2016 |
| WO | 2020/012605 A1 | 1/2020 |

OTHER PUBLICATIONS

Danno et al., 'Fast epitaxial growth of high-purity 4H-SiC(0001) in a vertical hot-wall chemical vapor deposition,' 2005, Journal of Electronic Materials, vol. 34, No. 4 p. 324-329 (Year: 2005).*

He et al., 'Investigation of the distribution of deep levels in 4H-SiC epitaxial wafer by DLTS with the method of decussate sampling,' Feb. 1, 2020, Journal of Crystal Growth, vol. 531, 125352 (Year: 2020).*

Office Action dated Apr. 12, 2022, issued in Japanese Application No. 2020-199012.

(Continued)

*Primary Examiner* — Bryan R Junge

(74) *Attorney, Agent, or Firm* — Sughrue Mion, PLLC

(57) ABSTRACT

A SiC epitaxial wafer according to an embodiment includes: a SiC substrate; and a SiC epitaxial layer formed on a first surface of the SiC substrate. The in-plane uniformity of a density of $Z_{1/2}$ centers of the SiC epitaxial layer is 5% or less.

12 Claims, 4 Drawing Sheets

(56) References Cited

OTHER PUBLICATIONS

Toshihiko Hayashi, Research on Carrier Life of p-Type SiC Crystals aiming at High Withstand Voltage Power Semiconductor Devices, Kyoto University Academic Information Repository KURENAI, Japan, 2013, <https://core.ac.uk/download/pdf/39300933.pdf>, 171 pages.

* cited by examiner

SIC EPITAXIAL WAFER AND METHOD FOR PRODUCING SIC EPITAXIAL WAFER

BACKGROUND OF THE INVENTION

Field of the Invention

The present invention relates to a SiC epitaxial wafer and a method for producing a SiC epitaxial wafer.

Priority is claimed on Japanese Patent Application No. 2020-199012, filed Nov. 30, 2020, the content of which is incorporated herein by reference.

Description of Related Art

Silicon carbide (SiC) has an insulation breakdown electric field which is an order of magnitude larger than that of silicon (Si) and a band gap which is three times larger than that of silicon (Si). Furthermore, silicon carbide (SiC) has characteristics such as a thermal conductivity which is about three times higher than that of silicon (Si). For this reason, silicon carbide (SiC) is expected to be applied to power devices, high frequency devices, high temperature operation device, and the like. For this reason, in recent years, SiC epitaxial wafers have been used for the semiconductor devices as described above.

SiC epitaxial wafers are obtained by forming SiC epitaxial layers on SiC substrates through chemical vapor deposition (CVD) methods. SiC epitaxial layers serve as active regions of SiC devices.

The characteristics of SiC device layers are affected by defects in SiC epitaxial layers. For example, Patent Document 1 describes that a carrier lifetime in a SiC epitaxial layer is affected by a $Z_{1/2}$ center in a SiC epitaxial layer.

PATENT DOCUMENTS

[Patent Document 1] Japanese Unexamined Patent Application, First Publication No. 2016-132604

SUMMARY OF THE INVENTION

As described above, since the characteristics of a SiC device are affected by a $Z_{1/2}$ center, it is preferable that a density and a distribution of $Z_{1/2}$ centers in a SiC epitaxial layer are able to be controlled. However, at the time of production, there are a plurality of parameters which affect a density and a distribution of $Z_{1/2}$ centers and it is difficult to control each of these parameters.

The present invention was made in view of the above problems, and an object of the present invention is to provide a SiC epitaxial wafer and a method for producing a SiC epitaxial wafer in which a density and a distribution of a $Z_{1/2}$ center are controlled and deterioration in characteristics of a device can be prevented when the present invention is provided as the device.

The present invention provides the following means to solve the above problems.

(1) A SiC epitaxial wafer according to a first aspect includes: a SiC substrate; and a SiC epitaxial layer formed on a first surface of the SiC substrate, wherein an in-plane uniformity of a density of $Z_{1/2}$ centers of the SiC epitaxial layer is 5% or less.

(2) The SiC epitaxial wafer according to the above aspect may have a diameter of 150 mm or more.

(3) The SiC epitaxial wafer according to the above aspect may have a diameter of 200 mm or more.

(4) In the SiC epitaxial wafer according to the above aspect, a density of point defects caused by carbon interstitials contained in the SiC epitaxial layer may be $1\times10^{11}$ cm$^{-3}$ or less.

(5) In the SiC epitaxial wafer according to the above aspect, densities of EH' centers, EH$_3$ centers, and RD$_3$ centers contained in the SiC epitaxial layer may be $1\times10^{11}$ cm$^{-3}$ or less.

(6) In the SiC epitaxial wafer according to the above aspect, densities of ON$_1$ centers and ON$_2$ centers contained in the SiC epitaxial layer may be $1\times10^{11}$ cm$^{-3}$ or less.

(7) In the SiC epitaxial wafer according to the above aspect, a difference between a density of $Z_{1/2}$ centers at a center of the SiC epitaxial layer and a density of $Z_{1/2}$ center density at a position 50 mm or more farther from the center of the SiC epitaxial layer may be 20% or less of a value of the density of the $Z_{1/2}$ centers at the center of the SiC epitaxial layer.

(8) A method for producing a SiC epitaxial wafer according to a second aspect includes: a test step; and a main step, wherein the test step includes: a first film formation step of forming a SiC epitaxial layer on a first surface of a test SiC substrate; a first measurement step of measuring an in-plane uniformity of a density of $Z_{1/2}$ centers of the SiC epitaxial layer; and a feedback step of performing first feedback for changing at least one of heating conditions in the first film formation step and temperature lowering conditions in the first film formation step on the basis of the measurement results from the first measurement step, the first film formation step, the first measurement step, and the feedback step are repeated a plurality of times in the test step, and the main step includes a second film formation step of forming a SiC epitaxial layer on a first surface of a SiC substrate on the basis of the results of the test step.

(9) In the method for producing a SiC epitaxial wafer according to the above aspect, the test step may further include: a first heat treatment step of subjecting the SiC epitaxial layer formed in the first film formation step to a heat treatment between the first film formation step and the first measurement step, and the feedback step may further performs second feedback for changing at least one of the heating conditions in the first heat treatment step and the temperature lowering conditions in the first heat treatment step on the basis of the result measured in the first measurement step.

(10) In the method for producing a SiC epitaxial wafer according to the above aspect, the main step may further include: a second heat treatment step of subjecting the SiC epitaxial layer formed in the second film formation step to heat treatment on the basis of the result of the test step.

(11) In the method for producing a SiC epitaxial wafer according to the above aspect, the first measurement step may be performed using a non-destructive inspection method.

(12) In the method for producing a SiC epitaxial wafer according to the above aspect, the main step may further include: a second measurement step of measuring in-plane uniformity of a density of $Z_{1/2}$ centers of the SiC epitaxial layer formed in the second film formation step.

(13) In the method for producing a SiC epitaxial wafer according to the above aspect, the second measurement step may be performed using a non-destructive inspection method.

The SiC epitaxial wafer and the method for producing a SiC epitaxial wafer according to the above aspect can obtain the expected characteristics of a device over the entire surface of the wafer when the present invention is provided for the device.

DETAILED DESCRIPTION OF THE INVENTION

Figure 1:
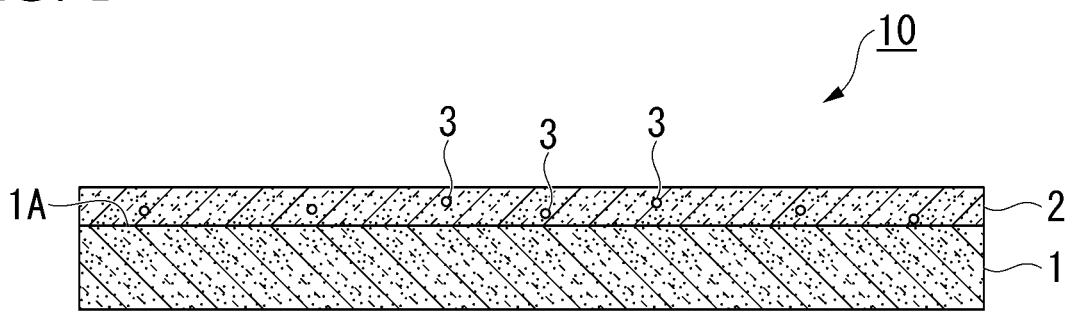
FIG. 1 is a cross-sectional view of a SiC epitaxial wafer according to an embodiment.

An embodiment will be described in detail below with reference to the drawings as appropriate. In the drawings used in the following description, enlarged characteristic parts may be shown in some cases for convenience to easily understand the features of the present invention and dimensional ratios or the like of each constituent element may differ from the actual one in some cases. The materials, the dimensions, and the like exemplified in the following description are examples, and the present invention is not limited thereto and can be appropriately modified and carried out without changing the gist of the present invention.

In the embodiment, a density of $Z_{1/2}$ centers may be referred to as a "$Z_{1/2}$ center density".

FIG. 1 is a cross-sectional view of a SiC epitaxial wafer 10 according to an embodiment. The SiC epitaxial wafer 10 includes a SiC substrate 1 and a SiC epitaxial layer 2.

The SiC substrate 1 is, for example, cut out from a SiC ingot. The SiC ingot is grown on a SiC seed crystal using, for example, a sublimation method.

The SiC epitaxial layer 2 is formed on a first surface 1A of the SiC substrate 1. The SiC epitaxial layer 2 is formed on the SiC substrate 1 using, for example, a CVD method. The SiC epitaxial layer 2 has a defect therein in some cases. Such a defect includes a stacking fault, a point defect, and the like. The SiC epitaxial layer 2 may have, for example, a $Z_{1/2}$ center 3 therein. $Z_{1/2}$ centers 3 are point defects accompanied by carbon vacancies. Each of the $Z_{1/2}$ centers 3 has a deep level ($E_c$—0.65 eV) and is a Shockley-Read-Hall (SRH) recombination center. That is to say, the $Z_{1/2}$ center 3 is one of carrier lifetime killer defects and affects a carrier lifetime.

The in-plane uniformity of the density of the $Z_{1/2}$ centers 3 in the SiC epitaxial layer 2 is controlled. The in-plane uniformity of the density of the $Z_{1/2}$ centers 3 in the SiC epitaxial layer 2 is 5% or less. The in-plane uniformity (a/mean) is obtained by dividing a standard deviation (a) by an average value (μ: mean value).

Figure 2:
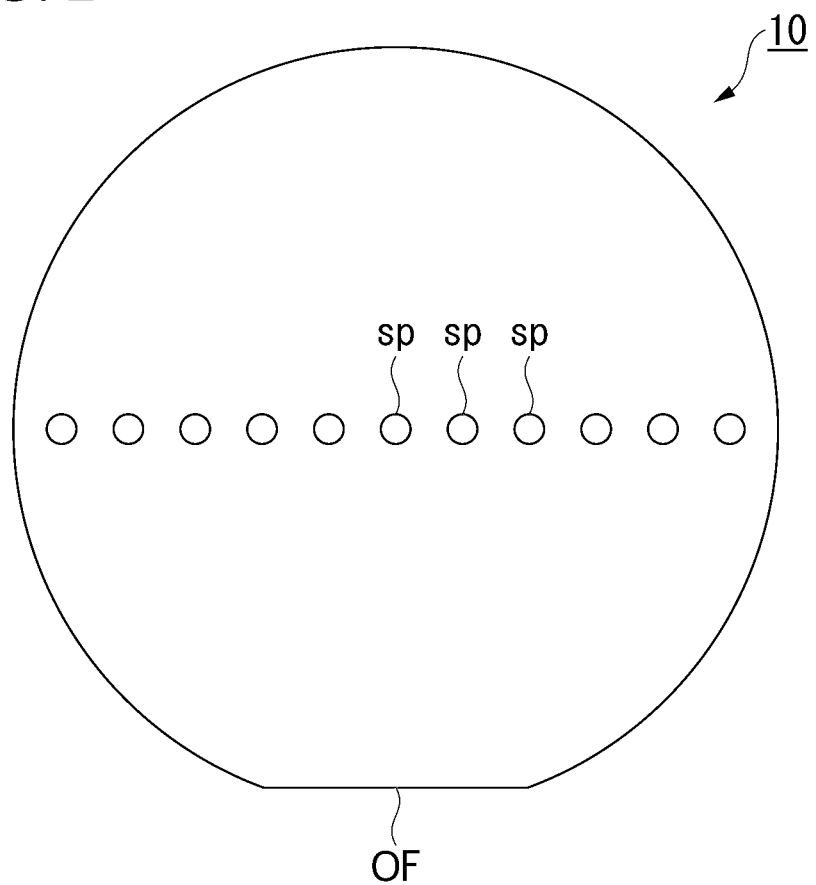
FIG. 2 is a plan view of the SiC epitaxial wafer according to the embodiment.

FIG. 2 is a plan view of the SiC epitaxial wafer 10 according to the embodiment. The in-plane uniformity of the density of the $Z_{1/2}$ centers 3 is obtained from, for example, the result from 10 or more measurement points sp in a radial direction passing through a center of the SiC epitaxial wafer 10. Although an example in which the measurement points sp are disposed in a direction parallel to an orientation flat OF is shown in FIG. 2, measurement points sp may be disposed in a direction perpendicular to the orientation flat OF or measurement points sp may be disposed in directions parallel to and perpendicular to the orientation flat OF.

The density of the $Z_{1/2}$ centers 3 at each of the measurement points sp in the SiC epitaxial layer 2 is, for example, $1 \times 10^{13}$ cm$^{-3}$ or less, and more preferably $1 \times 10^{12}$ cm$^{-3}$ or less. Furthermore, it is difficult to set the density of the $Z_{1/2}$ centers 3 to be zero, and the density of the $Z_{1/2}$ centers 3 is, for example, $1 \times 10^{10}$ cm$^{-3}$ or more.

A doping concentration of the SiC epitaxial layer 2 is, for example, $1 \times 10^{13}$ cm$^{-3}$ or more and $1 \times 10^{17}$ cm$^{-3}$ or less. Here, as the doping concentration is reduced, a lower limit of detection of point defects using a DLTS method which will be described later is reduced. For this reason, in the SiC epitaxial layer 2 having a density of the $Z_{1/2}$ centers 3 of $1 \times 10^{13}$ cm$^{-3}$ or less, the doping concentration is preferably $1 \times 10^{15}$ cm$^{-3}$ or less. The doping concentration is an effective doping concentration obtained by subtracting an acceptor concentration from a donor concentration in the case of an n type and an effective doping concentration obtained by subtracting a donor concentration from an acceptor concentration in the case of a p type. In the case of an n type, the lower the acceptor concentration, the more preferable, and in the case of a p type, the lower the donor concentration, the more preferable. The acceptor concentration in the case of an n type is, for example, $1 \times 10^{13}$ cm$^{-3}$ or less, and preferably $1 \times 10^{12}$ cm$^{-3}$ or less. The donor concentration in the case of the p type is, for example, $1 \times 10^{13}$ cm$^{-3}$ or less, and preferably $1 \times 10^{12}$ cm$^{-3}$ or less.

Also, for example, there are $1 \times 10^{12}$ cm$^{-3}$ or less, and preferably $1 \times 10^{11}$ cm$^{-3}$ or less of the point defects caused by carbon interstitials in the SiC epitaxial layer 2. Furthermore, no point defects caused by carbon interstitials may be contained in, for example, the SiC epitaxial layer 2. Each of the point defects caused by carbon interstitials is a defect caused by carbon present in a gap between lattices. The point defects caused by carbon interstitials are, for example, $EH_1$ centers, $EH_3$ centers, $RD_3$ centers, $ON_1$ centers, or $ON_2$ centers. Densities of the $EH_1$ centers, the $EH_3$ centers, and the $RD_3$ centers are preferably $1 \times 10^{11}$ cm$^{-3}$ or less. Densities of the $ON_1$ centers and the $ON_2$ centers are preferably $1 \times 10^{11}$ cm$^{-3}$ or less.

A carbon element which is a point defect caused by a carbon interstitial eliminates the $Z_{1/2}$ centers 3 through a heat treatment. On the other hand, the characteristics of the SiC device are affected by the point defect itself. Although the number of $Z_{1/2}$ centers 3 can be controlled by irradiating the SiC epitaxial layer 2 with an electron beam, if the SiC epitaxial layer 2 is irradiated with an electron beam, the point defects caused by carbon interstitials (for example, $EH_1$ centers, $EH_3$ centers, $RD_3$ centers) are generated at the same time. The $ON_1$ centers and the $ON_2$ centers are defects which are simultaneously generated in a process of eliminating the $Z_{1/2}$ centers such as carbon ion implantation or thermal oxidation, and it is difficult to fully reduce numbers of $ON_1$ centers and $ON_2$ centers through heat treatment. Here, the $ON_1$ centers and the $ON_2$ centers are not present in an epitaxial layer as it is which is epitaxially grown, or even if the $ON_1$ centers and the $ON_2$ centers are present, concentrations thereof are sufficiently low.

A film thickness of the SiC epitaxial layer 2 is, for example, 3 μm or more and 500 μm or less. As the film thickness increases, a film formation time increases. Thus, controlling of the in-plane uniformity of the density of the $Z_{1/2}$ centers 3 tends to be difficult.

A diameter of the SiC epitaxial wafer 10 is, for example, 150 mm or more, and may be 200 mm or more. As a size of the SiC epitaxial wafer 10 increases, the in-plane uniformity of the density of the $Z_{1/2}$ centers 3 tends to deteriorate. If a method for producing a SiC epitaxial wafer which will be described later is used, also in a large SiC epitaxial wafer 10 with a diameter of 150 mm or more, it is possible to maintain the in-plane uniformity of the density of the $Z_{1/2}$ centers 3 within a prescribed range. The diameter mentioned herein does not need to be exactly the numerical values stated above and has a deviation allowed within a range of common sense. For example, in the case of a wafer with a diameter of 150 mm, wafers with diameters of 149 mm or more and 151 mm or less may be used. Also, in the case of a wafer with a diameter of 200 mm, wafers with diameters of 199 mm or more and 201 mm or less may be used.

A difference between a $Z_{1/2}$ center density at a center of the SiC epitaxial layer 2 and a $Z_{1/2}$ center density at a position 50 mm or more farther from the center of the SiC epitaxial layer 2 is preferably 20% or less of a value of the $Z_{1/2}$ center density at the center of the SiC epitaxial layer 2. It is difficult to control an in-plane temperature distribution of the SiC epitaxial wafer 10, particularly, on an outer circumference. If the method for producing a SiC epitaxial wafer which will be described later is used, it is also possible to perform highly accurate adjustment of a temperature distribution on an outer circumferential portion. As a result, the uniformity of the $Z_{1/2}$ center density at an outer circumferential portion 50 mm or more farther from the center is also improved.

Figure 3:
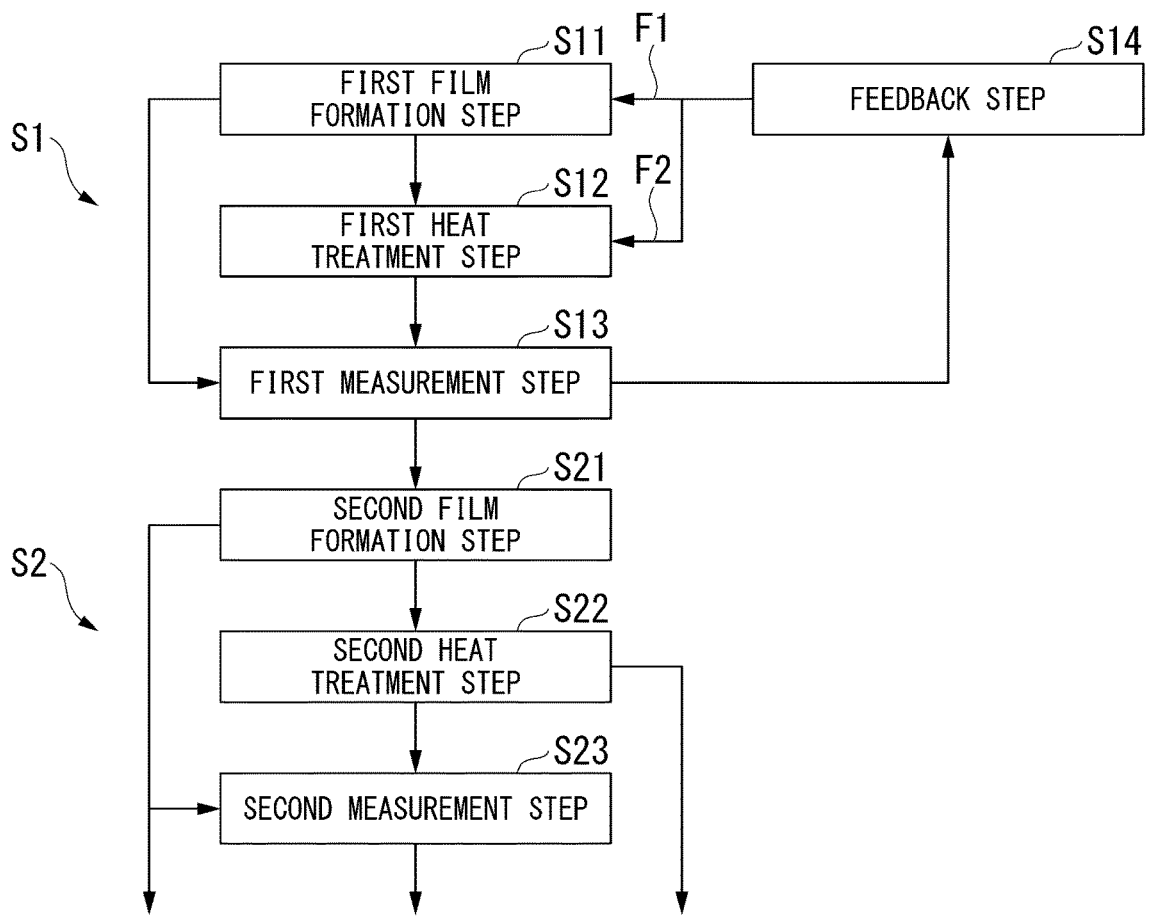
FIG. 3 is a flowchart of a method for producing a SiC epitaxial wafer according to the embodiment.

The method for producing a SiC epitaxial wafer according to the embodiment will be described below. FIG. 3 is a flowchart of the method for producing a SiC epitaxial wafer according to the embodiment. The method for producing a SiC epitaxial wafer according to the embodiment includes a test step S1 and a main step S2.

The test step S1 includes, for example, a first film formation step S11, a first heat treatment step S12, a first measurement step S13, and a feedback step S14. In the test step S1, the first heat treatment step S12 can be omitted and the first measurement step S13 may be performed after the first film formation step S11. In the test step S1, the first film formation step S11, the first measurement step S13, and the feedback step S14 are repeatedly performed a plurality of times to determine the optimum conditions. Furthermore, in the test step S1, the first film formation step S11, the first heat treatment step S12, the first measurement step S13, and the feedback step S14 are repeatedly performed a plurality of times as necessary to determine the optimum conditions.

In the first film formation step S11, the SiC epitaxial layer 2 is formed on the SiC substrate 1. In the first film formation step S11, there are many parameters used for determining the performance of the SiC epitaxial layer 2. Among these, the temperature conditions at the time of film formation and the temperature lowering conditions after film formation are parameters which have a significant influence on the in-plane uniformity of the density of the $Z_{1/2}$ centers 3. When a temperature at the time of film formation and a temperature lowering speed after film formation are uniform in a plane of the SiC epitaxial layer 2, the in-plane uniformity of the density of the $Z_{1/2}$ centers 3 is improved.

Subsequently, as necessary, the first heat treatment step S12 is performed. In the first heat treatment step S12, the SiC epitaxial wafer 10 is subjected to heat treatment. The heat treatment is a process of heating, such as, for example, annealing performed after the film formation of the SiC epitaxial layer 2, annealing performed after carbon ion implantation into the SiC epitaxial layer 2, annealing performed after a part of the SiC epitaxial layer 2 is thermally oxidized, and the like. The heat treatment can reduce the number of defects contained in the SiC epitaxial layer 2 immediately after the film formation. A heat treatment temperature is, for example, 1500° C. or higher. In the first heat treatment step S12, there are many parameters used for determining the performance of the SiC epitaxial layer 2. Among these, the temperature conditions at the time of heat treatment and the temperature lowering conditions after heat treatment are parameters which have a significant influence on the in-plane uniformity of the density of the $Z_{1/2}$ centers 3. The much the temperature at the time of heat treatment and the temperature lowering speed are uniform in the plane of the SiC epitaxial layer 2, the much in-plane uniformity of the density of the $Z_{1/2}$ centers 3 is improved.

Subsequently, in the first measurement step S13, the in-plane uniformity of the density of the $Z_{1/2}$ centers 3 of the SiC epitaxial layer 2 is measured. In the first measurement step S13, the density of the $Z_{1/2}$ centers 3 at each of 10 or more measurement points sp in the radial direction passing through the center of the SiC epitaxial wafer 10 is measured. Moreover, from the density of the $Z_{1/2}$ centers 3 at each of the measurement points sp, the in-plane uniformity of the density of the $Z_{1/2}$ centers 3 in the plane of the SiC epitaxial wafer 10 is obtained.

Although the first measurement step S13 may be a destructive inspection or a non-destructive inspection, it is realistic that the first measurement step S13 be performed through non-destructive inspection in consideration of the fact that the test step S1 is repeatedly performed. A deep level transient spectroscopy (DLTS) method is an example of destructive inspection. In the DLTS method, a part of the SiC epitaxial wafer 10 is cut out and Schottky electrodes are deposited on the SiC epitaxial layer 2 for measurement. If the DLTS method is performed at each of the plurality of measurement points sp for each test step S1, a huge amount of time is required.

Figure 4:
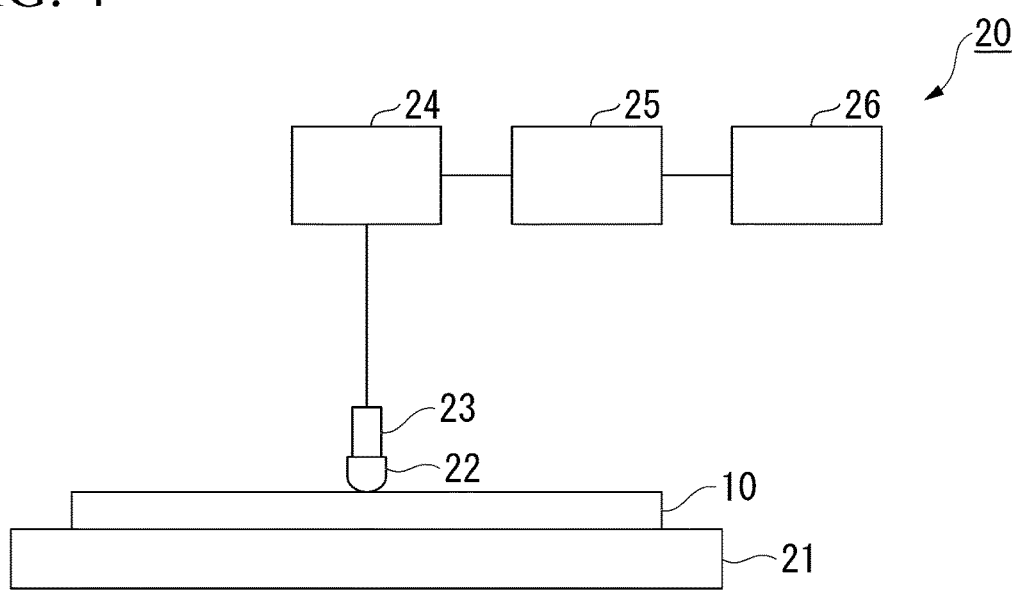
FIG. 4 is a schematic diagram of a measuring apparatus for measuring a $Z_{1/2}$ center density in a non-destructive manner.

A non-destructive inspection method which can be used in the first measurement step S13 will be described below. FIG. 4 is a schematic diagram of a measuring apparatus 20 for measuring the density of the $Z_{1/2}$ centers 3 in a non-destructive manner. The measuring apparatus 20 includes a stage 21, a contact 22, a probe 23, a pulse power supply 24, a capacitance meter 25, and an evaluation unit 26.

The SiC epitaxial wafer 10 is placed on the stage 21. The stage 21 or the probe 23 is movable and a relative position between the probe 23 and the SiC epitaxial wafer 10 can be changed.

The contact 22 is at a distal end of the probe 23. The contact 22 comes into contact with the SiC epitaxial layer 2 at the time of measurement. The contact 22 is a terminal for applying a voltage to the SiC epitaxial wafer 10 and functions as a Schottky electrode. The contact 22 is, for example, mercury. Mercury is a liquid at room temperature, and there is no need to deposit a metal electrode as in the case of utilizing a solid metal at room temperature as a Schottky electrode. For this reason, it is not necessary to cut out the SiC epitaxial wafer 10, and non-destructive inspection can be performed.

The pulse power supply 24 intermittently applies a voltage to the contact 22. When the contact 22 is in contact with the SiC epitaxial wafer 10, a voltage applied from the pulse power supply 24 is intermittently applied to the SiC epitaxial layer 2.

Figure 5:
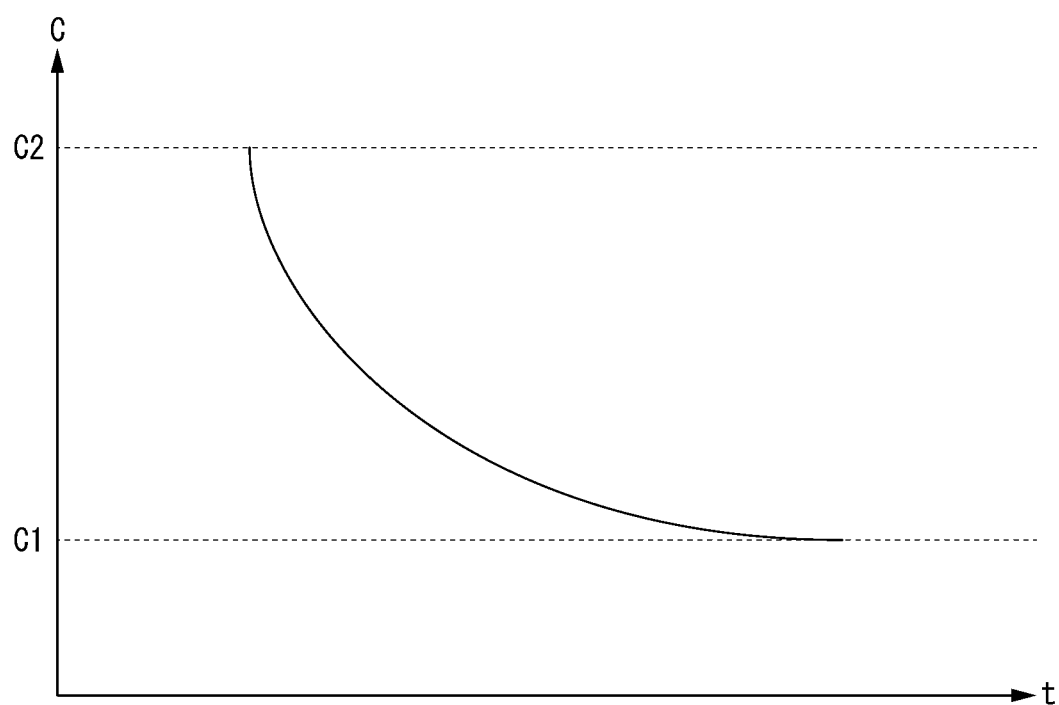
FIG. 5 is a diagram showing a change in capacitance of a SiC epitaxial wafer over time.

FIG. 5 is a diagram showing a change in capacitance over time of the SiC epitaxial wafer 10. A vertical axis in FIG. 5 indicates a capacitance of the SiC epitaxial wafer 10 and a horizontal axis indicates time. The capacitance of the SiC epitaxial wafer 10 is measured using the capacitance meter 25.

The capacitance of the SiC epitaxial wafer 10 in the state in which a voltage is not applied is indicated by C1. If a voltage is applied from the pulse power supply 24 to the SiC epitaxial wafer 10, the capacitance of the SiC epitaxial wafer 10 changes from C1 to C2. This is because electrons are trapped in a trap level of a point defect in an n-type semiconductor and holes are trapped in a p-type semiconductor.

If the application of a voltage is stopped, the trapped electrons and holes are released. As a result, with the elapse of time, the capacitance of the SiC epitaxial wafer 10 returns from C2 to C1. A density of the trapped electrons or holes corresponds to a density of point defects. A capacitance is approximately proportional to the density of point defects. For example, when there are many point defects, an absolute value of the capacitance C2 becomes larger than that when there are few point defects.

The evaluation unit 26 evaluates a state (type, density) of point defects in the SiC epitaxial layer 2 on the basis of the capacitance of the SiC epitaxial wafer 10 measured using the capacitance meter 25. For example, an attenuation curve shown in FIG. 5 is approximated using an exponential function to obtain an amount of change in signal intensity. Furthermore, a defect density is calculated using a value of a doping concentration determined in advance. For example, assuming that a doping concentration is N and a trap density is Nt, the defect density is obtained through Nt≈2N×|C2−C1|/C1. Furthermore, a time constant can be obtained from an index of an exponential function and an energy depth of a defect in a bandgap can also be evaluated. The trap density Nt corresponds to a density of point defects.

Here, the point defect is a defect in which a signal peaks near room temperature. If a correlation function (correlator) method is utilized, adjustment is possible so that a peak of an electrical signal is obtained near room temperature. If a signal intensity is evaluated while changing a period of a correlation function, it is possible to determine a period of the correlation function in which a maximum value of the signal intensity is obtained. The optimum value of the period of the correlation function depends on a type of defect (energy depth of the defect). Therefore, the $Z_{1/2}$ center 3 can be evaluated separately from a plurality of point defects.

As described above, when the non-destructive inspection method is utilized, it is possible to measure the density of the $Z_{1/2}$ centers 3 at each of the measurement points of the SiC epitaxial layer 2. In other words, it is possible to obtain the SiC epitaxial wafer 10 in which a specific density of the $Z_{1/2}$ centers 3 in the SiC epitaxial layer 2 is provided. Furthermore, since a non-destructive inspection method can be applied to the SiC substrate 1 alone which does not have the SiC epitaxial layer 2 formed thereon, it is also possible to obtain the SiC substrate 1 in which a specific density of the $Z_{1/2}$ centers 3 is provided.

Also, in the first measurement step S13, the in-plane uniformity of the density of the $Z_{1/2}$ centers 3 of the SiC epitaxial layer 2 is calculated from the result of the density of the $Z_{1/2}$ centers 3 at each of the measurement points of the SiC epitaxial layer 2. To be specific, an in-plane distribution of the density of the $Z_{1/2}$ centers 3 of the SiC epitaxial layer 2 is obtained by dividing a standard deviation (σ) of all the measurement points by an average value (μ: mean value).

Subsequently, the feedback step S14 is performed. The feedback step S14 is performed on the basis of a value of the in-plane uniformity of the density of the $Z_{1/2}$ centers 3 obtained in the first measurement step S13. The feedback step S14 performs at least one of a first feedback F1 and a second feedback F2. In the feedback step S14, for example, after the first feedback F1 is performed, the second feedback F2 is performed.

First, the test step S1 is performed without performing the first heat treatment step S12. In this case, since the first heat treatment step S12 is not performed, the in-plane uniformity of the density of the $Z_{1/2}$ centers 3 is affected by the first film formation step S11. The first feedback F1 is performed when a value of the in-plane uniformity of the density of the $Z_{1/2}$ centers 3 obtained in the first measurement step S13 is 5% or more.

In the first feedback F1, at least one of the heating conditions at the time of film formation and the temperature lowering conditions after film formation is changed. The heating conditions at the time of film formation include, for example, a temperature distribution in an in-plane direction. The temperature lowering conditions after film formation include, for example, a distribution of a temperature lowering rate in the in-plane direction. For example, it is possible to make the temperature distribution in the in-plane direction at the time of film formation and an in-plane distribution of the temperature lowering speed at the time of temperature lowering uniform by changing an output distribution of heaters (output adjustment of inner heater and outer heater), disposition thereof, or the like at the time of film formation or at the time of temperature lowering. That is to say, it is possible to make the temperature distribution in the in-plane direction at the time of film formation by changing an output distribution of heaters (output adjustment of inner heater and outer heater), disposition thereof, or the like. Similarly, it is possible to make the in-plane distribution of the temperature lowering speed at the time of temperature lowering uniform by changing an output distribution of heaters (output adjustment of inner heater and outer heater), disposition thereof, or the like.

In the case in which a second heat treatment step S22 is not performed in the main step S2, when a condition in which a value of the in-plane uniformity of the density of the $Z_{1/2}$ centers 3 is 5% or less is determined, the feedback step S14 is stopped and the test step S1 is terminated.

On the other hand, when the second heat treatment step S22 is performed in the main step S2, the test step S1 is further repeatedly performed. First, the first film formation step S11 is performed on the basis of the condition determined through the first feedback F1. Subsequently, the first heat treatment step S12 and the first measurement step S13 are performed. Although the first film formation step S11 is optimized through the first feedback F1, the value of the in-plane uniformity of the density of the $Z_{1/2}$ centers 3 measured in the first measurement step S13 may be 5% or more by adding the first heat treatment step S12 in some cases. When the value of the in-plane uniformity of the density of the $Z_{1/2}$ centers 3 obtained in the first measurement step S13 is 5% or more, the second feedback F2 is performed.

In the second feedback F2, at least one of the heating conditions at the time of heat treatment and the temperature lowering conditions after heat treatment is changed. The heating conditions at the time of heat treatment include, for example, a temperature distribution in the in-plane direction. The temperature lowering conditions after heat treatment include, for example, a distribution of a temperature lowering rate in the in-plane direction. For example, it is possible to make a temperature distribution in the in-plane direction at the time of heat treatment and an in-plane distribution of a temperature lowering speed at the time of temperature lowering uniform by changing an output distribution of heaters (output adjustment of inner heater and outer heater), disposition thereof, or the like at the time of film formation or at the time of temperature lowering. That is to say, it is possible to make the temperature distribution in the in-plane direction at the time of film formation by changing an output distribution of heaters (output adjustment of inner heater and outer heater), disposition thereof, or the like. Similarly, it is possible to make the in-plane distribution of the temperature lowering speed at the time of temperature lowering uniform by changing an output distribution of heaters (output adjustment of inner heater and outer heater), disposition thereof, or the like.

When a condition in which the value of the in-plane uniformity of the density of the $Z_{1/2}$ centers 3 is 5% or less is determined, the feedback step S14 is stopped and the test step S1 is terminated. At this point, the conditions of the first film formation step S11 and the first heat treatment step S12 are optimized through the first feedback F1 and the second feedback F2. Therefore, the conditions are set as the conditions for the main step S2.

The main step S2 includes, for example, a second film formation step S21, the second heat treatment step S22, and a second measurement step S23. The main step S2 is performed on the basis of the result of the test step S1.

In the second film formation step S21, the SiC epitaxial layer 2 is formed on the first surface 1A of the SiC substrate 1 for an actual operation. In the second film formation step S21, a film is formed on the basis of the conditions optimized in the test step S1.

Subsequently, the second heat treatment step S22 is performed. The second heat treatment step S22 may be omitted. For example, when the first heat treatment step S12 is optimized through the second feedback F2, the second heat treatment step S22 is performed. In the second heat treatment step S22, the SiC epitaxial layer 2 formed in the second film formation step S21 is subjected to heat treatment. In the second heat treatment step S22, heat treatment is performed on the basis of the conditions optimized in the test step S1.

Subsequently, the second measurement step S23 is performed. The second measurement step S23 may be omitted. The second measurement step S23 may include a shipping test. The second measurement step S23 can be performed in the same manner as in the first measurement step S13 and is performed in a non-destructive manner. It is possible to confirm the in-plane uniformity of the density of the $Z_{1/2}$ centers 3 in an actual sample to be shipped by performing the second measurement step S23.

In principle, the in-plane uniformity of the density of the $Z_{1/2}$ centers 3 of the SiC epitaxial wafer prepared in the main step S2 is equivalent to that in the test step S1. Therefore, when the main step S2 is performed, it is possible to obtain the SiC epitaxial wafer 10 in which the in-plane uniformity of the density of the $Z_{1/2}$ centers 3 in the SiC epitaxial layer 2 is 5% or less.

A temperature when the SiC epitaxial layer 2 is formed or subjected to heat treatment may exceed 1600° C. in some cases which is a significantly high temperature. For this reason, the precise measurement itself of these temperature conditions is difficult, and it is difficult to precisely control the temperature conditions.

For example, a radiation thermometer (pyrometer) is known as one method for measuring a temperature of the SiC epitaxial wafer 10. The pyrometer measures a temperature of an object by converting heat irradiation from the object into a temperature. For this reason, in order to measure a temperature accurately, it is necessary to know the emissivity of the object precisely. However, it is difficult to precisely measure the emissivity of the object having a high temperature close to 1600° C. and only conversion from the emissivity at a temperature lower than 1600° C., for example, room temperature can be performed. In this case, precise temperature conversion is difficult.

In order to measure a temperature distribution in a surface of a wafer, it is necessary to precisely measure a temperature in the surface of the wafer at a plurality of points. As described above, the precise measurement itself of a temperature is difficult, and it is also difficult to maintain the position accuracy of the measurement point in the surface of the wafer. For example, since the pyrometer performs measurement through an optical method, it is difficult to keep the position accuracy of the measurement point high. Furthermore, a wafer which is being subjected to film formation may rotate in many cases, and it is more difficult to maintain the position accuracy of the measurement point.

On the other hand, in the method for producing a SiC epitaxial wafer according to the embodiment, when a distribution of the density of the $Z_{1/2}$ centers 3 in the SiC epitaxial layer 2 is fed back, the heating conditions at the time of film formation or heat treatment are indirectly changed. Therefore, in the method for producing a SiC epitaxial wafer according to the embodiment, it is not necessary to directly measure a temperature of the SiC epitaxial wafer 10.

Also, when the feedback described above is repeatedly performed, it is possible to find the optimum heating conditions at the time of film formation or heat treatment. The feedback step becomes more precise as the number of measurement points sp increases and requires more time for measurement as the number of measurement points sp increases. If the measurement in each of the measurement points sp is performed in a destructive inspection manner, the time will be enormous. Meanwhile, when the distribution of the density of the $Z_{1/2}$ centers 3 is measured in a non-destructive manner, it is possible to increase the number of feedbacks. Furthermore, also when the number of measurement points sp increases, the time required for measurement does not increase divergently and the number of measurement points sp can be increased. As a result, it is possible to find a condition in which the in-plane uniformity of the density of the $Z_{1/2}$ centers 3 in the SiC epitaxial layer 2 is 5% or less in a realistic time. This condition is also device-dependent, and the finding of the condition in which the in-plane uniformity of the density of the $Z_{1/2}$ centers 3 in the SiC epitaxial layer 2 is 5% or less in a realistic time significantly contributes to mass production.

Finally, the SiC epitaxial wafer prepared in the above procedure is made into chips and an active region, electrodes, and the like are formed on each of the chips to form SiC devices. Each of the SiC devices has a homogeneous density of $Z_{1/2}$ centers 3 and exhibits high characteristics.

Although an example of the embodiment has been illustrated above, the present invention is not limited to such embodiments. For example, combinations of characteristic constitutions of the embodiments, addition to other constitutions, and the like may be performed.

EXAMPLES

Example 1

Figure 6:
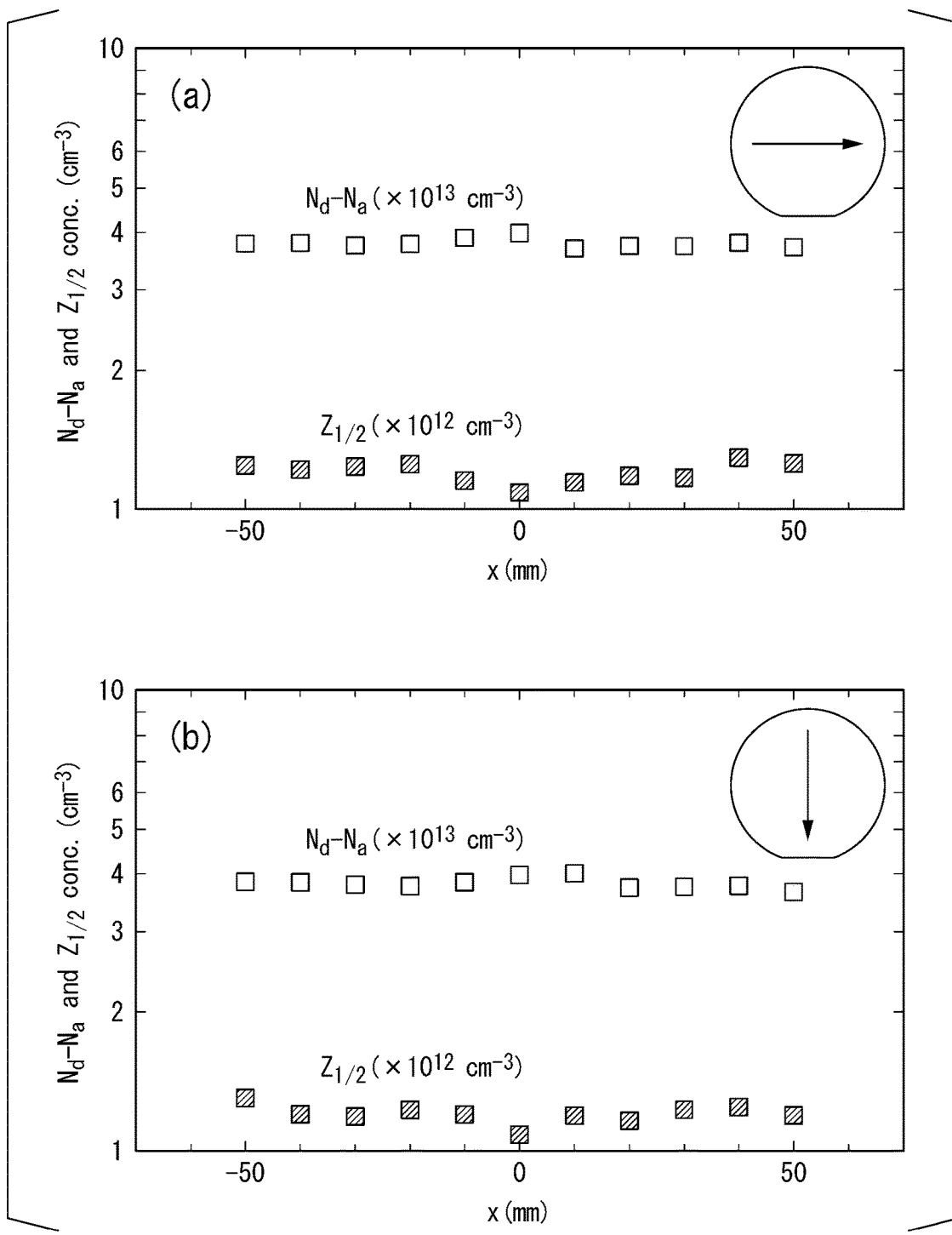
FIG. 6 shows a density of $Z_{1/2}$ centers and a doping concentration at each measurement point in Example 1.

The test step S1 described above was repeatedly performed a plurality of times to determine the optimum conditions for film formation and heat treatment. Moreover, as the main step S2, a SiC epitaxial layer with a thickness of 16 μm was formed on a 4H-SiC substrate with a diameter of 150 mm. A doping concentration and a $Z_{1/2}$ center density of the SiC epitaxial layer were obtained in the non-destructive manner shown in FIG. 4. Measurement points were measured in a cross shape at a pitch of 10 mm within a range of a radius of 50 mm from a center of the SiC substrate. The $Z_{1/2}$ center density was obtained from a measurement value of the doping concentration at each of the measurement points. FIG. 6 shows the $Z_{1/2}$ center density and the doping concentration at each of the measurement points in Example 1. In FIG. 6, Nd is a donor concentration and $N_a$ is an acceptor concentration.

As shown in FIG. 6, the $Z_{1/2}$ center density and the doping concentration were uniform in the in-plane direction. An average value of doping concentrations was $(3.8\pm0.1)\times10^{13}$ cm$^{-3}$ and an average value of $Z_{1/2}$ center densities was $(1.2\pm0.1)\times10^{12}$ cm$^{-3}$. Furthermore, the in-plane uniformity had the doping concentration being 2% and the $Z_{1/2}$ center density being 4%. That is to say, a SiC epitaxial wafer having high uniformity of a $Z_{1/2}$ center density in which a carrier lifetime was determined was prepared.

A point defect peak other than a $Z_{1/2}$ center and an $EH_{6/7}$ center was not confirmed in an epitaxial layer prepared under the same conditions through a DLTS method for destructive inspection. It was confirmed that a density of point defects ($EH_1$ center, $EH_3$ center, $RD_3$ center, $ON_1$ center, $ON_2$ center) caused by carbon interstitials was also a detection lower limit ($1\times10^{11}$ cm$^{-3}$) or less. That is to say, it was confirmed that these point defects were absent or sufficiently low.

Table 1 which will be shown below is obtained by summarizing measurement values at a center point measured in a cross and four measurement points corresponding to end portions of the cross.

TABLE 1

| | Coordinates | $Z_{1/2}$ center density ($\times10^{12}$ cm$^{-3}$) | Difference between measurement values of center point and end portion |
|---|---|---|---|
| Center point | (0 mm, 0 mm) | 1.08 | — |
| First end portion | (0 mm, 50 mm) | 1.19 | 10% |
| Second end portion | (0 mm, −50 mm) | 1.30 | 20% |
| Third end portion | (−50 mm, 0 mm) | 1.24 | 15% |
| Fourth end portion | (50 mm, 0 mm) | 1.26 | 16% |

As shown in Table 1, a difference between a $Z_{1/2}$ center density at a center point and a $Z_{1/2}$ center density at each of four end portions was 20% or less of a value of the $Z_{1/2}$ center density at the center point. The numbers after the decimal point are rounded off.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 SiC substrate
2 SiC epitaxial layer
3 $Z_{1/2}$ center
10 SiC epitaxial wafer
20 Measuring apparatus
21 Stage
22 Contact
23 Probe
24 Pulse power supply
25 Capacitance meter
26 Evaluation unit
F1 First feedback
F2 Second feedback
sp Measurement point
S1 Test step
S2 Main step
S11 First film formation step
S12 First heat treatment step
S13 First measurement step
S14 Feedback step
S21 Second film formation step
S22 Second heat treatment step
S23 Second measurement step

What is claimed is:

1. A SiC epitaxial wafer, comprising:
a SiC substrate; and
a SiC epitaxial layer formed on a first surface of the SiC substrate,
wherein in-plane uniformity of a density of $Z_{1/2}$ centers of the SiC epitaxial layer is 5% or less,
a diameter of the SiC epitaxial wafer is 149 mm or more,
the in-plane uniformity of a density of $Z_{1/2}$ centers is obtained by dividing a standard deviation at 10 or more measurements points by an average value, and
wherein the measurement points are arranged in a cross shape at a pitch of 10 mm within a range of a radius of 50 mm from a center of the SiC epitaxial wafer.

2. The SiC epitaxial wafer according to claim 1, which has a diameter being 199 mm or more.

3. The SiC epitaxial wafer according to claim 1, wherein a density of point defects caused by carbon interstitials contained in the SiC epitaxial layer is $1\times10^{11}$ cm$^{-3}$ or less.

4. The SiC epitaxial wafer according to claim 1, wherein densities of $EH_1$ centers, $EH_3$ centers, and $RD_3$ centers contained in the SiC epitaxial layer are $1\times10^{11}$ cm$^{-3}$ or less.

5. The SiC epitaxial wafer according to claim 1, wherein densities of $ON_1$ centers and $ON_2$ centers contained in the SiC epitaxial layer are $1\times10^{11}$ cm$^{-3}$ or less.

6. The SiC epitaxial wafer according to claim 1, wherein a difference between a density of $Z_{1/2}$ centers at a center of the SiC epitaxial layer and a density of $Z_{1/2}$ centers at a position 50 mm or more farther from the center of the SiC epitaxial layer is 20% or less of a value of the density of the $Z_{1/2}$ centers at the center of the SiC epitaxial layer.

7. A method for producing a SiC epitaxial wafer, comprising:
a test step; and
a main step,
wherein the test step includes:
a first film formation step of forming a SiC epitaxial layer on a first surface of a test SiC substrate;
a first measurement step of measuring in-plane uniformity of a density of $Z_{1/2}$ centers of the SiC epitaxial layer; and
a feedback step of performing first feedback for changing at least one of heating conditions in the first film formation step and temperature lowering conditions in the first film formation step on the basis of the result measured in the first measurement step, the test step repeatedly performs the first film formation step, the first measurement step, and the feedback step a plurality of times, and the main step includes a second film formation step of forming a SiC epitaxial layer on a first surface of a SiC substrate on the basis of the result of the test step, the in-plane uniformity of a density of $Z_{1/2}$ centers is obtained by dividing a standard deviation at 10 or more measurements points by an average value, and wherein the measurement points are arranged in a cross shape at a pitch of 10 mm within a range of a radius of 50 mm from a center of the SiC epitaxial wafer.

8. The method for producing a SiC epitaxial wafer according to claim 7, wherein the test step further includes:

a first heat treatment step of subjecting the SiC epitaxial layer formed in the first film formation step to heat treatment between the first film formation step and the first measurement step, and the feedback step further performs second feedback for changing at least one of the heating conditions in the first heat treatment step and the temperature lowering conditions in the first heat treatment step on the basis of the result measured in the first measurement step.

9. The method for producing a SiC epitaxial wafer according to claim 8, wherein the main step further includes:

a second heat treatment step of subjecting the SiC epitaxial layer formed in the second film formation step to heat treatment on the basis of the result of the test step.

10. The method for producing a SiC epitaxial wafer according to claim 7, wherein the first measurement step is performed using a non-destructive inspection method.

11. The method for producing a SiC epitaxial wafer according to claim 7, wherein the main step further includes:

a second measurement step of measuring in-plane uniformity of a density of a $Z_{1/2}$ center of the SiC epitaxial layer formed in the second film formation step.

12. The method for producing a SiC epitaxial wafer according to claim 11, wherein the second measurement step is performed using a non-destructive inspection method.

* * * * *